United States Patent [19]

Lipson et al.

[11] Patent Number: 4,610,951
[45] Date of Patent: Sep. 9, 1986

[54] PROCESS OF USING A FLEXIBLE, FAST PROCESSING PHOTOPOLYMERIZABLE COMPOSITION

[75] Inventors: Melvin A. Lipson, Fullerton; Gene A. Derrico, Garden Grove; Sung Y. Tark, Irvine; Toshio Yamazaki, Mission Viejo, all of Calif.

[73] Assignee: Dynachem Corporation, Tustin, Calif.

[21] Appl. No.: 746,685

[22] Filed: Jul. 25, 1985

Related U.S. Application Data

[62] Division of Ser. No. 501,199, Jun. 6, 1983, Pat. No. 4,539,286.

[51] Int. Cl.$^4$ .................................................. G03C 5/00
[52] U.S. Cl. .................................... 430/313; 430/271; 430/314; 430/318; 430/328; 430/275
[58] Field of Search ............... 430/271, 275, 281, 288, 430/905, 910, 917, 313, 314, 318, 328

[56] References Cited

U.S. PATENT DOCUMENTS

| | | | |
|---|---|---|---|
| 2,690,968 | 10/1954 | Powers | 95/88 |
| 2,852,379 | 9/1958 | Hepher et al. | 96/91 |
| 2,893,868 | 7/1959 | Barney | 96/115 |
| 2,923,673 | 2/1960 | Munger | 204/158 |
| 2,927,022 | 3/1960 | Martin et al. | 96/35 |
| 3,024,180 | 3/1962 | McGraw | 204/165 |
| 3,060,023 | 10/1962 | Burg et al. | 96/28 |
| 3,440,047 | 4/1969 | Levinos et al. | 96/35.1 |
| 3,458,311 | 7/1969 | Alles | 96/35.1 |
| 3,475,171 | 10/1969 | Alles | 96/115 |
| 3,495,987 | 2/1970 | Moore | 96/115 |
| 3,547,651 | 12/1970 | Roos | 96/115 P |
| 3,615,630 | 10/1971 | Dietrich | 204/159.16 |
| 3,616,367 | 10/1971 | Zunker | 117/93.31 |
| 3,625,744 | 12/1971 | Juna et al. | 96/36 |
| 3,660,088 | 5/1972 | Lundsager | 96/35.1 |
| 3,695,877 | 10/1972 | Taneda et al. | 96/35.1 |
| 3,708,296 | 1/1973 | Schlesinger | 96/33 |
| 3,718,473 | 2/1973 | Gervay et al. | 96/83 |
| 3,765,898 | 10/1973 | Bauer et al. | 96/115 P |
| 3,796,578 | 3/1974 | Hosoi et al. | 96/62 |
| 3,804,631 | 4/1974 | Faust | 96/115 |
| 3,833,384 | 9/1984 | Noonan et al. | 96/115 P |
| 3,850,770 | 11/1974 | Juna et al. | 204/159.19 |
| 3,867,153 | 2/1975 | MacLachlan | 96/79 |
| 3,882,168 | 5/1975 | Klupfel et al. | 260/486 R |
| 3,930,865 | 1/1976 | Faust et al. | 96/86 P |
| 4,097,417 | 6/1978 | Pastor et al. | 252/501 |
| 4,192,685 | 3/1980 | Horike et al. | 430/283 |

FOREIGN PATENT DOCUMENTS

| | | |
|---|---|---|
| 614181 | 2/1961 | Canada . |
| 750324 | 1/1967 | Canada . |
| 0035574 | 8/1980 | European Pat. Off. . |
| 1817107 | 7/1970 | Fed. Rep. of Germany . |
| 741294 | 11/1955 | United Kingdom . |
| 795961 | 6/1958 | United Kingdom . |
| 801093 | 9/1958 | United Kingdom . |
| 802853 | 10/1958 | United Kingdom . |
| 835849 | 5/1960 | United Kingdom . |
| 1042520 | 9/1966 | United Kingdom . |
| 1118154 | 6/1968 | United Kingdom . |
| 1148362 | 4/1969 | United Kingdom . |
| 1180846 | 2/1970 | United Kingdom . |
| 1188921 | 4/1970 | United Kingdom . |
| 1354541 | 5/1974 | United Kingdom . |

*Primary Examiner*—Jack P. Brammer
*Attorney, Agent, or Firm*—Gerald K. White

[57] ABSTRACT

A photopolymerizable composition comprised of an addition polymerizable material, a photoinitiator, a thermal addition polymerization inhibitor and a polymeric binding agent. The addition polymerizable material is comprised of a defined monoethylenically unsaturated acrylate and one or more non-gaseous compounds having at least two terminal ethylenic groups. The photopolymerizable composition displays superior flexibility and develops and strips more efficiently when compared to a like composition but in the absence of the acrylate. The photopolymerizable composition may be in the form of sheet or roll on a film support which can be laminated to a substrate and can be used in the preparation of printed circuit boards.

10 Claims, No Drawings

PROCESS OF USING A FLEXIBLE, FAST PROCESSING PHOTOPOLYMERIZABLE COMPOSITION

CROSS-REFERENCE TO RELATED APPLICATION

This is a division of application Ser. No. 501,199, filed June 6, 1983 and now U.S. Pat. No. 4,539,286.

BACKGROUND OF THE INVENTION

1. Field of the Invention

The present invention relates to a flexible, fast processing, photopolymerizable composition and to a sheet or roll prepared from the composition. The present invention also relates to a coated composition comprised of the flexible, fast processing, photopolymerizable composition on a substrate and to a process for making a printed circuit board using the flexible, fast processing, photopolymerizable composition.

2. Description of the Prior Art

Photopolymerizable compositions have long been known in the art. During their evolution, various chemical compounds have been used as a photopolymerizable component of the composition. One development in the art is disclosed in U.S. Pat. No. 2,760,863. This patent relates to a photopolymerizable composition useful in the preparation of printing plates which is comprised of an ethylenically unsaturated, photopolymerizable monomer, a photoinitiator, a polymerization inhibitor and a polymeric binding agent. The composition is coated onto a substrate, dried, exposed to actinic radiation through a stencil or negative and developed to remove the unexposed portions of the composition thereby forming the printing plate.

U.S. Pat. No. 3,469,982 marks an advance over the photopolymerizable composition described in U.S. Pat. No. 2,760,863. Rather than being applied as a liquid, this later patent discloses a photopolymerizable composition which is coated onto a flexible film base or support and then covered with a removable cover film. In use, the cover film is peeled off, the photopolymerizable composition is laminated to a substrate, exposed to actinic radiation through a negative, the film support is peeled off and the composition is developed in an organic solvent. To form a printed circuit board, the developed composition on the substrate is then subjected to etching and finally stripped in another organic solvent In U.S. Pat. No. 3,036,914, a photopolymerizable composition having improved flexibility which is useful for preparing printing plates is disclosed. The composition is comprised of: (1) an addition polymerizable, ethylenically unsaturated compound, such as diacrylates and acrylic or methacrylic acid esters of polyalkylene glycols; (2) a photoinitiator,; (3) a high molecular weight polyethylene oxide; and (4) at least one essentially linear cellulose ester.

Improved flexibility is also the goal of U.S.S.R. Pat. No. 190,211. This goal is allegedly achieved by a photopolymerizable composition comprised of a photopolymerizable oligomer, a photoinitiator and a mixture of copolymers; the first being a copolymer of methacrylic acid and methyl methacrylate and the second being a copolymer of methacrylic acid or acrylic acid with butyl acrylate, alkyl methacrylate or alkyl acrylates containing 5 to 8 carbon atoms in the alkyl group.

In U.S. Pat. No. 3,887,450, and divisional U.S. Pat, No. 3,953,309, a significant advance in the art is set forth. These patents disclose a photopolymerizable composition which can be made into a storable sheet or roll on a film support. The composition may be used to prepare a printed circuit board and yet can be developed and stripped using aqueous solutions containinq an alkaline agent. The photopolymerizable composition is comprised of a photopolymerizable ethylenically unsaturated monomer, a photoinitiator, a polymerization inhibitor and a binding agent which is a polymer of one or more of a defined styrene or vinyl monomer with one or more of a defined alpha, beta-ethylenically unsaturated carboxylic acid- or anhydride-containing monomer. The ratio of the monomers is selected to yield the required performance characteristics.

A further advance in the art is disclosed in U.S. Pat. No. 4,239,849. This patent describes a flexible photopolymerizable composition that is resistant to cold flow which may be formed into a dry film on a film support and, after exposure to actinic radiation, which may be developed in dilute aqueous alkaline solutions. The composition is comprised of one or more additional polymerizable, ethylenically unsaturated compounds, a photoinitiator and a preformed macromolecular polymeric binding agent. The binding agent is a copolymer of a styrene-type monomer, an acrylate-type monomer and an unsaturated carboxyl-containing monomer.

OBJECTS AND SUMMARY OF THE INVENTION

It is a general object of the present invention to provide a substantive advance in the art of photopolymerizable compositions.

It is a more specific object of the present invention to provide a photopolymerizable composition which possesses a high degree of flexibility.

It is another object of the present invention to provide a photopolymerizable composition that develops more rapidly and clearly so that the exposed surface of the substrate can be processed efficiently.

It is another object of the present invention to provide a photopolymerizable composition which, when photopolymerized, may be stripped from a substrate more quickly thereby facilitating recovery of the substrate.

It is a further object of the present invention to provide a highly flexible sheet or roll of a photopolymerizable composition on a film support.

It is a still further object of the present invention to provide an improved photopolymerizable composition laminated onto a substrate.

It is yet a further object of the present invention to provide a process for preparing a printed circuit board by employing an improved photopolymerizable composition.

In one aspect, the present invention provides a photopolymerizable composition which on a 100 parts basis comprises:

A. from about 10 to about 60 parts by weight of an addition polymerizable material comprised of
  (i) from about 5 to about 50 parts by weight of an acrylate of the formula

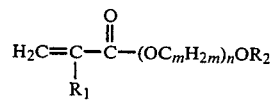

wherein m is from 1 to 4, n is from 1 to 12, $R_1$ is selected from the group consisting of H, $CH_3$ and mixtures thereof and $R_2$ is selected from the group consisting of unsubstituted phenyl, substituted phenyl, unsubstituted naphthenyl, substituted naphthenyl, branched or unbranched, substituted or unsubstituted alkyl having 1 to 12 carbon atoms, substituted or unsubstituted cycloalkyl having 5 or 6 carbon atoms in the ring and mixtures thereof and (ii) from about 5 to about 50 parts by weight of one or more non-gaseous compounds, containing at least two terminal ethylenic groups and having a boiling point above 100° C.;

B. from about 0.001 to about 20 parts by weight of a photoinitiated free-radical generating addition polymerization initiating system;

C. from about 0.001 to about 5 parts by weight of a thermal-addition polymerization inhibitor; and D. from about 40 to about 90 parts by weight of a preformed macromolecular polymeric binding agent which is a polymer of:

(i) a first monomeric material which contains one or more non-acidic compounds selected from the group having the general formulas

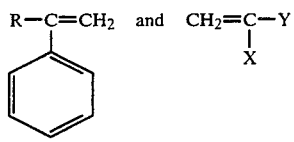

wherein R is hydrogen, an alkyl group having from 1 to 6 carbon atoms or a halo group wherein, when X is hydrogen, Y is

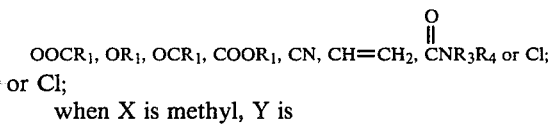

$OOCR_1$, $OR_1$, $OCR_1$, $COOR_1$, CN, $CH=CH_2$, $CNR_3R_4$ or Cl; or Cl;

when X is methyl, Y is

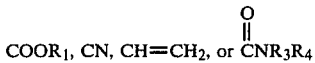

$COOR_1$, CN, $CH=CH_2$, or $CNR_3R_4$ and when X is chlorine, Y is Cl; and wherein $R_1$ is an alkyl qroup having from 1 to 12 carbon atoms, a phenyl group or a benzyl group and $R_3$ and $R_4$ are hydrogen, an alkyl group having from 1 to 12 carbon atoms or a benzyl group; and (ii) a second monomeric material which consists essentially of one or more alpha,beta ethylenically unsaturated carboxylic acid- or anhydride-containing monomers having from 3 to 15 carbon atoms;

wherein the ratio of the first monomeric material to the second monomeric material is sufficient to render substantially all of the binding agent soluble in a substantialy wholly aqueous solution containing 1% by weight of sodium carbonate.

In other aspects, the present invention provides a sheet or roll of the photopolymerizable composition on a film support and a laminate comprised of the photopolymerizable composition coated onto a substrate. In a further aspect, the present invention provides a process for makinq a printed circuit board by employing the improved photopolymerizable composition.

DESCRIPTION OF THE PREFERRED EMBODIMENTS

As stated hereinabove, the present invention relates to an improved photopolymerizable composition. The composition is comprised of an addition polymerizable material, a photoinitiated free-radical generating addition polymerization initiating system, a thermal-addition polymerization inhibitor and a preformed macromolecular polymeric binding agent.

Based on 100 parts by weight of the dried photopolymerizable composition, the addition polymerizable material is present in an amount ranging from about 10 to about 60 parts by weight and is comprised of from about 5 to about 50 parts, preferably from about 8 to about 25 parts by weight of an acrylate and from about 5 to about 50 parts, preferably from about 8 to about 25 parts by weight of one or more non-gaseous compounds containing at least two terminal ethylenic groups and having a boiling point above 100° C.

The acrylate has the general formula:

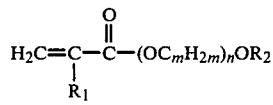

wherein m is from 1 to 4, preferably is 2 or 3, and most preferably is 2, n is from 1 to 12, preferably from 2 to 8 and most preferably is 2 or 3, $R_1$ is selected from the group consisting of H, $CH_3$ and mixtures thereof and is preferably H, and $R_2$ is selected from the group consisting of unsubstituted phenyl, substituted phenyl, unsubstituted naphthenyl, substituted naphthenyl, branched or unbranched, substituted or unsubstituted alkyl having 1 to 12, preferably 4 to 8 carbon atoms, substituted or unsubstituted cycloalkyl having 5 or 6 carbon atoms in the ring, and mixtures thereof $R_2$ is preferably unsubstituted phenyl, substituted phenyl and mixtures thereof and is most preferably unsubstituted phenyl. The substituents on the phenyl or naphthenyl are selected such that they do not substantially adversely affect the characteristics of the photopolymerizable composition and may be halogens, especially chlorine, bromine and iodine, alkyl and alkoxy, either group having 1 to 15, preferably 1 to 6 carbon atoms and mixtures thereof.

Acrylates within the scope of the present invention have a low volatility as indicated by a boiling point greater than about 175° C., preferably greater than 200° C. and possess a molecular weight greater than about 240, preferably greater than about 280. Additionally, the acrylates are selected such that they do not result in the degradation of the photopolymerized composition when subjected to etching or plating and do not cause degradation of the aqueous developing or stripping baths.

Exemplary acrylates are phenoxypolymethoxymethyl acrylates and methacrylates, phenoxypolyethoxyethyl acrylates and methacrylates, phenoxypolypropoxypropyl acrylates and methacrylates, phenoxypolybutoxybutyl acrylates and methacrylates, chlorophenoxypolymethoxymethyl acrylates and methacrylates, chlorophenoxypolyethoxyethyl acrylates and methacrylates, chlorophenoxypolypropoxypropyl acrylates and methacrylates, chlorophenoxypolybutoxybutyl acrylates and methacrylates, naphthoxypolymethoxymethyl acrylates and methacrylates, naphthoxypolyethoxyethyl acrylates and methacrylates, naphthoxypolypropoxypropyl acrylates and methacrylates, naphthoxypolybutoxybutyl acrylates and methacrylates, t-butoxypolymethoxymethyl acrylates and methacrylates, t-butoxypolyethoxyethyl acrylates and methacrylates, t-butoxypolypropoxypropyl acrylates and methacrylates, t-butoxypolybutoxybutyl acrylates and methacrylates, cyclohexoxypolymethoxymethyl acrylates and methacrylates, cyclohexoxypolyethoxyethyl acrylates and methacrylates, cyclohexoxypolypropoxypropyl acrylates and methacrylates and cyclohexoxypolybutoxybutyl acrylates and methacrylates. The preferred acrylates are substituted and unsubstituted phenoxypolyethoxyethyl acrylates and substituted and unsubstituted phenoxypolypropoxypropyl acrylates with the most preferred acrylates being phenoxy (di, tri, tetra or penta) ethoxyethyl acrylate Such acrylates are available commercially or may be synthesized by the process of reacting formaldehyde or the appropriate alkylene oxide (e.g., ethylene oxide) with the alcohol form of the $R_2$ and then esterifying the resulting product with acrylic acid or methacrylic acid in the presence of a suitable acidic catalyst.

The presence of the acrylate monomer in the photopolymerizable composition imparts significant advantages thereto. In particular, the acrylate improves the flexibility and tack of the photopolymerizable composition which improves the handling characteristics of sheets or rolls made of the composition and facilitates lamination to a substrate. Moreover, the acrylate enables the photopolymerized composition to retain a high degree of flexibility. Upon development, the presence of the acrylate in the unexposed portions of the composition facilitates efficient (i.e., rapid and complete) removal from the substrate. Yet, in the photopolymerized portions of the composition, the acrylate improves the efficiency of the stripping operation.

The second component of the addition polymerizable material is capable of forming a high polymer by free-radical photoinitiated, chain propagating addition polymerization. Such compounds are disclosed in U.S. Pat. Nos. 2,760,863, 3,887,450 and 3,953,309, the contents of which are incorporated by reference.

Preferably, the compounds are non-gaseous at 20° C. and atmospheric pressure, have 2 to 4 or more terminal ethylenic groups and exert a plasticizing action on the polymeric binding agent. Suitable compounds, which may be used alone or in combination, include an alkylene or a polyalkylene glycol diacrylate prepared from alkylene glycols having 2 to 15 carbons or polyalkylene ether glycols of 1 to 10 ether linkages.

Because of their generally more rapid rate of insolubilization on exposure, presumably due to a relatively rapid establishment of a network polymer structure, an outstanding class of low molecular weight addition polymerizable components are those having a plurality of addition polymerizable ethylenic linkages, particularly when present as terminal linkages, and especially those wherein at least one and preferably most of such linkages are conjugated with a doubly bonded carbon, including carbon doubly bonded to carbon and to such heteroatoms as nitrogen, oxygen, and sulfur. Outstanding are such materials wherein the ethylenically unsaturated groups, especially the vinylidene groups, are conjugated with ester or amide structures. The following specific compounds are further illustrative of this class: unsaturated esters of polyols, particularly such esters of the methylene carboxylic acids, e.g., ethylene diacrylate; diethylene glycol diacrylate; glycerol diacrylate; glycerol triacrylate; ethylene dimethacrylate; 1,3-propylene dimethacrylate or diacrylate; 1,2,4,-butane triol trimethacrylate or triacrylate; 1,4-benzene-diol dimethacrylate or diacrylate; pentaerythritol methacrylates or acrylates; 1,5-pentanediol dimethacrylate or diacrylate; the bis-acrylates and methacrylates of polyethylene and polypropylene glycols of molecular weight 200-500, such as tripropyleneglycol diacrylate, and the like; unsaturated amides, particularly those of the methylene carboxylic acids, and especially those of alpha, omega-diamines and oxygen-interrupted omega-diamines, such as methylene bisacrylamide; methylene bismethacrylamide; 1,6-hexamethylene bisacrylamide; diethylenetriamine trismethacrylamide; bis(methacrylamidopropoxy)ethane; beta-methacrylamidoethyl methacrylate; N-[(beta-hydroxyethyloxy)ethyl] acrylamide; vinyl esters such as divinyl succinate, divinyl adipate, divinyl phthalate, divinyl terephthalate, divinyl benzene-1,3-disulfonate, and divinyl butane-1,4-disulfonate; and unsaturated aldehydes, such as sorbaldehyde (hexadienal).

To a certain extent, the poly-ethylenically unsaturated compound may be substituted with a monofunctional compound chemically compatible with the types of compounds discussed previously. However, the amount of such monofunctional compound must not be such as to substantially adversely affect the characteristics (e.g., odor, solubility, toxicity, etc.) of the photopolymerizable or photopolymerized composition. As can be understood, the permitted amount of monofunctional compound varies with the particular compound and the other components of the composition.

The photoinitiated free-radical generating addition polymerization initiating system is present in an amount ranging from about 0.001 to about 20 parts by weight and may be one or more compounds activatable by actinic light and which are preferably thermally inactive at 185° C. and below.

Such compounds include the substituted or unsubstituted polynuclear quinones, such as 9,10-anthraquinone; 1-chloroanthraquinone; 2-chloroanthraquinone; 2-methylanthraquinone; 2-ethylanthraquinone; 2-tert-butylanthraquinone; octamethylanthraquinone; 1,4-naphthoquinone; 9,10-phenanthraquinone; 1,2-benzanthraquinone; 2,3-benzanthraquinone; 2-methyl-1,4-naphthoquinone; 2,3-dichloronapthoquinone 1,4-dimethylanthraqui none; 2,3-dimethylanthraquinone; 2-phenylanthraquinone; 2,3-diphenlyanthraquinone; sodium salt of anthraquinone alphasulfonic acid; 3-chloro-2-methylanthraquinone; retenequinone; 7,8,9,10-tetrahydronaphthacenequinone; 1,2,3,4-tetrahydrobenz(a)anthracene-7,12-dione.

Also suitable as photoinitiators are the xanthones, thioxanthones, chlorothioxanthones, alkylated thioxanthones, alkyl p-dimethylaminobenzoates and other p-dialkyl aminobenzoate esters, and phenyl dialkoxyacetophenones.

The following photoinitiators, described in previously mentioned U.S. Pat. No. 2,760,863, some of which may be thermally active at temperatures as low as 85° C., are also useful; vicinal ketaldonyl compounds, such as diacetyl and benzil; alphaketaldonyl alcohols, such as benzoin and pivaloin; acyloin ethers, e.g., benzoin methyl and ethyl ethers; alpha-hydrocarbon substituted aromatic acyloins; alpha-methylbenzoin; alpha-allylbenzoin; and alpha-phenylbenzoin.

Silver persulfate is also useful as a free-radical generating initiator activatable by actinic radiation. Certain aromatic ketones, e.g., benzophenone and 4,4'-bisdialkylamino-benzophenones, are also useful.

The thermal-addition polymerization inhibitor is present in an amount ranging from about 0.001 to about 5 parts by weight. Inhibitors useful in the present invention include p-methoxyphenol, hydroquinone, and alkyl and arylsubstituted phenols, hydroquinones and quinones, tert-butyl catechol, pyrogallol, copper resinate, naphthylamines, betanaphthol, cuprous chloride, 2,6-di-tert-butyl p-cresol, 2,2-methylenebis-(4-ethyl-6-t-butyl-phenol), phenothiazine, pyridine, nitrobenzene, dinitrobenzene, p-toluquinone, chloranil, aryl phosphites, and aryl alkyl phosphites.

The polymeric binding agent is present in an amount ranging from about 40 to about 90 parts by weight and is a copolymer of one or more non-acidic compounds with one or more acidic compounds. The non-acidic compounds have the general formula

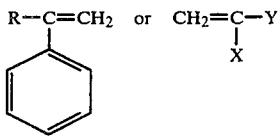

wherein R is hydrogen or an alkyl group having from 1 to 6 carbon atoms or a halo group. The benzene ring may be ring substituted with functional groups, such as nitro, alkoxy, acyl, carboxyl, sulpho, hydroxyl or halo and the formula should be understood to include such substituents unless otherwise stated. From 1 to 5 benzene substituents may be present, preferably, the substituents are a single alkyl group such as a methyl or t-butyl group. Most preferred of these compounds are styrene, alpha-methyl styrene, para-methyl styrene and para-t-butyl styrene.

The presence of the styrene-type monomer in the polymeric binding agent imparts to the composition improved resistance to the developing and etching or plating solutions. Therefore, depending on the developing and surface modifying conditions selected, the presence and amount of the styrene-type constituent may be selected to yield acceptable development and acceptable resistance to the surface modifying conditions.

With regard to the second general formula, when X is hydrogen, Y is $OOCR_1$, $OR_1$, $OCR_1$, $COOR_1$, CN, $CH=CH_2$, $\overset{O}{\overset{\|}{C}}NR_3R_4$ or Cl;

or Cl;

when X is methyl, Y is $COOR_1$, CN, $CH=CH_2$, or $\overset{O}{\overset{\|}{C}}NR_3R_4$;

and when X is chlorine, Y is Cl; and wherein $R_1$ is an alkyl group having from 1 to 12 carbon atoms, a phenyl or a benzyl group and $R_3$ and $R_4$ are hydrogen, an alkyl group having 1 to 12 carbon atoms or a benzyl group.

Examples of these vinyl-type monomers are vinyl acetate, vinyl butyrate, vinyl benzoate, vinyl chloride, vinylidene chloride, methyl methacrylate and methyl acrylate, acrylonitrile and methacrylonitrile, methacrylamide, and alkyl substituted acrylamides, vinyl methyl ketone, vinyl propyl ketone, vinyl methyl ether, vinyl ethyl ether and vinyl hexyl ether.

The vinyl-type monomer may also be an acrylate-type monomer which includes alkyl and hydroxyalkyl acrylates and methacrylates wherein the alkyl group has from 1 to 12, preferably from 1 to 6, carbon atoms. Examples of these materials include methyl methacrylate, ethyl acrylate, butyl acrylate, hydroxypropyl methacrylate, hydroxyethyl methacrylate and hydroxyethyl acrylate. Also, advantageously, mixtures of two or more of these compounds may be used.

The presence of the acrylate-type monomer in the polymeric binding agent imparts to the photopolymerizable composition improved cold flow and flexibility. These features help enable the dry film to be stored as sheets or rolls for long periods of time substantially without fear of degradation caused by cold flow or loss of flexibility.

The acidic monomer may be one or more alpha, beta-ethylenically unsaturated carboxyl containing monomers having from 3 to 15 carbon atoms, preferably from 3 to 6 carbon atoms. Most preferred compounds are acrylic acid and methacrylic acid. Other acids which may be used are cinnamic acid, crotonic acid, sorbic acid, itaconic acid, propiolic acid, maleic acid, and fumaric acid, or the corresponding half esters or, where possible, the corresponding anhydride.

The ratio of the styrene-type or vinyl-type monomer to the acidic comonomer is selected so that the copolymer is soluble in the aqueous alkali medium selected for development. If the amount of the styrene-type or vinyl-type monomer is too high, the unexposed portion of the composition will not be sufficiently soluble; on the other hand, if the amount of styrene-type or vinyl-type monomer is too low, the exposed area of the composition will be tacky, swollen, or dissolved in the aqueous alkali. As one convenient criteria, the binder copolymer should be such that a 40 percent solution in ketones or alcohols will have a viscosity of from 100 to 50,000 centipoises. A further convenient criteria is that substantially all of the copolymer will be solubilized in a dilute substantially wholly aqueous solution containing 2% by weight of sodium carbonate at 25° C. in about one hour. In this criteria, the term substantially has been used to indicate the level of acceptable development of the photopolymerizable composition and to reflect the fact that while some organic material may be present in the solution, such as by design, accident or reuse of the developing solution, the presence of such organic material is not required for acceptable development.

Representative comonomer weight ratios are from about 70:30 to about 85:15 for styrene-acrylic acid or methacrylic acid; from about 70:30 to about 85:15 for methyl methacrylate or combinations of alkyl acrylates or alkyl methacrylates-acrylic acid and/or methacrylic acid; from about 35:65 to about 70:30 for styrene-monobutyl maleate and from about 70:30 to about 95:5 for vinyl acetate-crotonic acid. The degree of polymerization of the binder-copolymer is such that the binding agent forms a non-tacky continuous film upon casting from an appropriate solvent and after appropriate drying. Broadly, the molecular weight is from 1,000 to 500,000. The ranges for the copolymer ratios and the degree of polymerization required for the useful particular binders can be readily ascertained by testing the solubility in a dilute alkali solution In this regard, mixtures of the monomeric materials as well as mixtures of copolymers may be used to form the binding agent to obtain the desired properties thereof.

In the event that improved resistance to developing and surface modifying solutions as well as improved flexibility and improved cold flow are desired, the polymeric binding agent may be formulated in accordance with the general teachings of previously mentioned U.S. Pat. No. 4,239,849, the contents of which are incorporated by reference. As fully explained therein, the polymer binding agent is a copolymer of: (1) the styrene-type monomer; (2) the acrylate-type monomer; and (3) the acidic monomer within the definitions previously given.

The amounts of the components forming the terpolymer binding agent are selected to at least fulfill the criteria noted previously. As a guideline, the following weight proportions may be followed to prepare the polymeric binding agent.

| Binder Component | Broad Range | Preferred Range |
| --- | --- | --- |
| Styrene-type | 10-60% | 10-35% |
| Acrylate-type | 15-75% | 40-75% |
| Carboxylic acid-type | 15-40% | 18-30% |

If desired, the photopolymerizable composition of the present invention may also contain plasticizers, adhesion promoters, dyes and pigments. Suitable colorants will be compatible with the photosensitive compositions and not interfere appreciably with the photosensitivity of the composition. The following specific compounds are illustrative: Fuchsine (C.I. 42510); Auramine Base (C.I. 4100B); Calcocid Green S (C.I. 44090); Para Magenta (C.I. 42500); Tryparosan (C.I. 42505); New Magenta (C.I. 42520); Acid Violet RRH (C.I. 42425); Red Violet 5RS (C.I. 42690); Nile Blue 2B (C.I. 51185); New Methylene Blue GG (C.I. 51195); C.I. Basic Blue 28 (C.I. 42585); Iodone Green (C.I. 42556); Night Green B (C.I. 42115); C.I. Direct Yellow 9 (C.I. 19540); C.I. Acid Yellow 17 (C.I. 18965); C.I. Acid Yellow 20 (C.I. 18900); Tartrazine (C.I. 19140); Supramine Yellow G (C.I. 19300); Buffalo Black 10B (C.I. 27790); Naphthalene Black 12R (C.I. 20350); Fast Black L (C.I. 51215); Ethyl Violet (C.I. 42600); Pontacyl Wool Blue BL (C.I. 50315); Pontacyl Wool Blue GL (C.I. 42320). (Numbers obtained from the second edition of the Color Index.)

The photopolymerizable composition of the present invention exhibits remarkable versatility. While the composition may be used to prepare printing plates, it possesses the more demanding characteristics required for a successful photoresist in the preparation of a printed circuit board. In particular, after a printing plate composition is coated onto the substrate, it is exposed to actinic radiation through a stencil and contacted with the developing solution to remove those portions of the composition which have been shielded from the radiation. The exposed portions of the composition are then inked and used for producing printed images.

In significant contrast, a photopolymerizable composition which is to be used as a photoresist must of course be capable of being exposed and developed, but the exposed portions of the composition must also be unaffected by etching solutions, such as a 45° Baume solution of ferric chloride, and/or electroplating solutions, such as acid copper sulfate. Despite its resistance to the aggressive solutions used in etching or plating, the photopolymerized composition must be capable of being stripped from the substrate so that the processing of the printed circuit board can be completed.

The photopolymerizable composition of the present invention meets all the stated criteria and hence may be successfully employed as a photoresist in the preparation of printed circuit boards. In this regard, the photopolymerizable composition can be coated onto a flexible film support and be formed into sheets or rolls which are capable of being stored for an extended time before being used. When in this form, the photopolymerizable composition of the present invention is characterized by a uniform thickness in the range of from about 0.0005 to about 0.005 inches and is free of defects such as voids, pinholes, bubbles, patterns or the like.

The flexible film support may be any material which adequately supports the photopolymerizable composition, does not react with the composition and can be readily separated from the composition, such as by peeling, either before or after exposure to actinic radiation. Materials which satisfy these criteria are high polymers, such as polyamides, polyolefins, polyesters, vinyl polymers and cellulose esters having a thickness in the range of from about 0.0005 to about 0.002 inches. One preferred film support is a film of polyethylene terephthalate having a thickness of about 0.001 inch.

When in the form of a sheet or roll, the photopolymerizable composition may be protected by a cover sheet on the side opposite to the film support thereby forming a sandwich structure with the photopolymerizable composition in the middle. The cover sheet may be the same or a different material than the film support and may have a thickness in the same range given previously for the film support. One particularly suitable material is a film of polyethylene having a thickness of about 0.001 inch.

In use, at least a portion of the sheet or roll is laminated to a substrate. The substrate may be plates, sheets or foils of plastic, steel, aluminum, copper, zinc, magnesium, etc. or may be composites containing such materials. Preferably, the substrate is a copper clad laminate, such as a copper clad, epoxy-fiberglass board, which is a common precursor for a printed circuit board. Lamination may be achieved by removing the cover sheet, if present, and pressing the photopolymerizable composition directly onto one side or both sides (if a two sided board is desired) of the substrate at an elevated temperature in the range of from about 65° to about 150° C. One way in which the lamination step may be accomplished is by passing the substrate in contact with the composition between heated rubber coated rollers.

After lamination, the film support may be removed or, more preferably, if a film support which permits sufficient passage of actinic radiation is employed, it may remain on the laminate during the exposure step. To obtain the desired pattern, a process transparency, e.g. a process negative or positive, stencil, mask, continuous tone, negative or positive image, is laid over the photopolymerizable composition of the laminate. The purpose of the process transparency (artwork) is to prevent exposure to actinic radiation of those portions of the composition which are to be removed during development and to permit exposure actinic radiation of those portions which are to remain after development.

The actinic radiation employed is selected such that photopolymerization is accomplished within a reasonable time of from about one second to about 5 minutes. Since freeradical generating addition-polymerization initiators activatable by actinic radiation generally exhibit their maximum sensitivity in the ultraviolet range, the radiation source should furnish an effective amount of this radiation. Both point or broad radiation sources are effective. Such sources include carbon arcs, mercury-vapor arcs, fluorescent lamps with ultraviolet radiation-emitting phosphors, argon glow lamps, electronic flash units and photographic flood lamps. Of these, the mercury-vapor arcs, particularly the sun lamps, are most suitable. In certain circumstances it may be advantageous to expose with visible light, using a photoinitiator sensitive in the visible region of the spectrum, e.g., 9,10-phenanthraquinone. In such cases, the radiation source should furnish an effective dose of visible radiation. Many of the radiation sources listed above furnish the required amount of light energy.

As stated previously, one of the significant advantages of the present invention is that the composition remains flexible upon photopolymerization. This advantage is important in view of the possible uses of the composition and the processing steps commonly encountered. In particular, where flexible substrates are employed, flexing of the laminated, exposed substrates will not cause cracking of the photopolymerized composition. For example, in high volume production, the photopolymerized composition of the present invention can withstand processing performed on a continuous basis wherein the exposed laminate is rolled onto a collection drum prior to further processing. Even where flexible substrates are not employed, the flexible nature of the photopolymerized composition helps to prevent chipping as the laminated, exposed substrates are handled (e.g., by stacking) and effectively protects the inner surfaces of through hole connections and other punch outs during the processing of the exposed laminates.

The improved flexibility of the photopolymerized composition of the present invention can be demonstrated by mounting the photopolymerizable composition on a flexible substrate, exposing all of the composition to actinic radiation in a dose sufficient to photopolymerize the composition and then subjecting it to a flexibility test. One convenient apparatus for conducting the flexibility test is the Conical Mandrel, Model MG-1416 available from Gardner Laboratory Inc. of Bethesda, Md.

As described in the Gardner Laboratory Inc. brochure entitled "Film Flexibility" published April, 1976, The Conical Mandrel Model MG-1416 is designed to test the flexibility of coated panels by bending them over a cone of known maximum and minimum diameters which allows the simultaneous determination of the damage caused by distension of the coating through a range of magnitudes. The Mandrel is composed of coated aluminum-bronze and has a cone diameter which increases uniformly from 0.125 to 1.50 inches. In use, the test panel (up to 0.03125 inch thick) is held securely by a clamp and then folded around the cone by means of a manually operated arm that is pivoted at the ends and is on the axis of the cone.

Using the described Conical Mandrel, the photopolymerized composition of the present invention displays superior flexibility when compared to a like photopolymerized composition, but without the defined acrylate. This is evidenced by the ability of the photopolymerized composition of the present invention to be folded around the mandrel without cracking and/or by cracking to a lesser degree when compared to a like photopolymerized composition that does not contain the defined acrylate.

After the exposure step, the film support is separated from the composition and the resulting exposed laminate is subjected to development. Development is achieved in a dilute substantially wholly aqueous alkaline solution whereby the shielded portions of the composition are removed and the exposed portions remain substantially unaffected. The composition of the present invention can be developed in a 1% by weight solution of sodium carbonate. Of course, an equivalent strength solution of another alkaline agent may likewise be used or the composition can be formulated such that it will develop successfully in even more aggressive alkaline solutions.

Suitable alkaline solutions contain from about 0.01 to about 10%, preferably from about 0.5% to about 3% by weight of alkaline agents such as alkali metal hydroxides, e.g., lithium, sodium and potassium hydroxide; the base-reacting alkali metal salts of weak acids, e.g., lithium, sodium, and potassium carbonates and bicarbonates; amines having a base-ionization constant greater than about $1\times10^{-14}$, e.g., primary amines, such as, benzyl, butyl and allyl amines; secondary amines, e.g., dimethylamine and benzyl methyl amine; tertiary amines, e.g., trimethylamine, and triethylamine; primary, secondary, and tertiary hydroxyamines, e.g., propanol, diethanol and triethanol amines, and 2-amino-2-hydroxymethyl-1,3-propanediol; cyclic amines, e.g., morpholine, piperidine, piperazine, and pyridine; polyamines, such as hydrazine, ethylene and hexamethylene diamines; the water-soluble basic salts, e.g., the carbonates and bicarbonates of the above amines; ammonium hydroxide and tetra-substituted ammonium hydroxides, e.g., tetramethyl-, tetraethyl-, trimethylbenzyl-, and trimethylphenylammonium hydroxides, sulfonium hydroxides, e.g., trimethyl-, diethylmethyl-, dimethylbenzylsulfonium hydroxides, and the basic soluble salts thereof, e.g., the carbonates, bicarbonates and sulfides; alkali metal phosphates and pyrophosphates, e.g., sodium and potassium triphosphates and sodium and potassium pyrophosphates; tetra-substituted (preferably wholly alkyl) phosphonium, arsonium, and stibonium hydroxide, e.g., tetramethyl-phosphonium hydroxide.

After the developing step, the substrate may be recovered, if it is to be used as a printing plate, or may be subjected to etching or plating if a printed circuit board is to be prepared. Of course, the particular substrate is initially selected depending on the desired end use.

In the preparation of printed circuit boards, the developed substrate can be passed through a series of chemical baths to reactivate the exposed metal (e.g., copper). A further advantage of the composition of the present invention is that the unexposed portions of the composition develop cleanly leaving little or no residue on the metal surface thereby facilitating reactivation. Moreover, the photopolymerized portions of the composition are substantially unaffected by the 1-5% by weight solutions of hydrochloric acid, sulfuric acid, ammonium persulfate, optionally with surfactants, commonly found in the reactivating bath.

Etching or plating is accomplished in those conventional environments known to those of ordinary skill in the art. That is, while the exposed (i.e., photopolymerized) portions of the composition of the present invention will not be substantially affected by sequential contact with the developing solution, the reactivating solution, if used, and a 45° Baume etching solution of ferric chloride, it should be apparent that other etching or plating solutions can likewise be used to modify the exposed substrate substantially without causing deterioration of the resist. Other etching or plating solutions are exemplified by solutions of cupric chloride, ammoniacal etchants, ammonium persulfate, chromic-sulfuric acids, copper sulfate and tin/lead fluoroborates.

In order to employ the printed circuit board for its intended purpose, it is necessary to ultimately remove the exposed portions of the composition (i.e., the photoresist) from the substrate. This is generally achieved by employing a more aggressive aqueous alkaline solution than which is used in the developing step. Thus, for example, while the photopolymerized composition of the present invention can be stripped from the substrate using a heated solution containing 3% by weight of sodium hydroxide, it should be understood that other alkaline solutions, such as those formulated from the alkaline agents disclosed above, can likewise be employed.

The composition of the present invention can also be used as a resist in the process of chemical machining of parts (which are often too small to be acceptably stamped) whereby a metallic sheet or foil is deeply etched or even completely etched through from one side to the other. In the process, the photopolymerizable composition is applied to both sides of the metallic sheet or foil and exposed through identical photographic transparencies as is commonly known in the art. The unexposed portions of the composition are removed in a developing step, as previously described, and the bared surfaces of the metallic sheet or foil are etched as required. Thereafter, the photopolymerized portions of the composition are stripped and the finished product may be recovered and used.

Another important advantage of the present invention pertains to the ease with which the exposed portions of the composition can be stripped from the substrate. This advantage enables the overall processing time to be further reduced which is a decided advantage in the art. By employing the defined acrylate monomer of the present invention in the addition polymerizable material, the stripping time can be reduced by about 10 to about 80%, when compared to the same composition, but not containing the acrylate monomer, under the same stripping conditions.

From the foregoing description of the photopolymerizable composition of the present invention and how it may be formed into sheets or rolls, laminated to a substrate, exposed, developed, subjected to etching or plating and stripped from the substrate, it should be apparent that the photopolymerizable composition of the present invention does not require additional chemical moieties, such as salt groups, in order for it to successfully meet these requirements. Hence, while conventional additives, such as pigments, dyes, adhesion promoters, plasticizers, etc, may be added to enhance the composition of the present invention, the composition consists essentially of the claimed ingredients since it does not require additional chemical moieties, such as salt groups, in order to be employed.

In order to further illustrate the present invention and the advantages thereof, the following specific examples are given, it being understood that these examples are intended only to be illustrative without serving as a limitation on the scope of the present invention.

EXAMPLE I

The following solutions are coated onto a 1 mil thick polyester film, and dried in a current of hot air, provided by a GE-1500 watt fan drier for 20 minutes. The dry thickness of the sensitized layers is about 1.3 mils. The dried layers are covered with a 1 mil thick polyethylene film. Formula IA is illustrative of the invention while Formula IB is a control solution.

| FORMULA IA | | |
|---|---|---|
| (a) | Copolymer of 37% styrene and 63% monobutyl maleate, average mol. wt. 20,000, viscosity of 10% aqueous solution of ammonium salt = 150 cps | 38.5 g |
| (b) | Copolymer of 95% vinyl acetate and 5% crotonic acid, average mol. wt. 90,000, viscosity of 8.6% ethyl alcohol solution between 13 and 18 cps | 1.5 g |
| (c) | 2,2'-methylene-bis-(4-ethyl-6-tert-butylphenol) | 0.06 g |
| (d) | 2-Chlorothioxanthone | 0.5 g |
| (e) | Ethyl p-dimethylaminobenzoate | 4.0 g |
| (f) | Hecto Blue B dye | 0.04 g |
| (g) | Crystal Violet Base | 0.015 g |
| (h) | Tripropyleneglycol diacrylate | 15.0 g |
| (i) | Phenoxydiethoxyethyl acrylate | 10.0 g |
| (j) | Methyl ethyl ketone | 70.0 g |
| FORMULA IB | | |
| (a) | Copolymer of 37% styrene and 63% monobutyl maleate, average mol. wt. 20,000, viscosity of 10% aqueous solution of ammonium salt = 150 cps | 38.5 g |
| (b) | Copolymer of 95% vinyl acetate and 5% crotonic acid, average mol. wt. 90,000, viscosity of 8.6% ethyl alcohol solution between 13 and 18 cps | 1.5 g |
| (c) | 2,2'-methylene-bis-(4-ethyl-6-tert-butylphenol) | 0.6 g |
| (d) | 2-Chlorothioxanthone | 0.5 g |
| (e) | Ethyl p-dimethylaminobenzoate | 4.0 g |
| (F) | Hecto Blue B dye | 0.04% |
| (g) | Crystal Violet Base | 0.015 g |
| (h) | Tripropylene glycol diacrylate | 25.0 g |
| (i) | Methyl ethyl ketone | 70.0 g |

A piece of copper-clad, epoxy fiberglass board is cleaned by scouring with an abrasive cleaner, swabbing, and thoroughly rinsing in water. It is then given a 20 second dip in a 12% solution of hydrochloric acid, rinsed again with water, and dried with air jets The polyethylene cover sheet is removed from a section of the sandwiched photopolymerizable element. The bared resist coating with its polyester support is laminated to the clean copper with the surface of the photopolymerizable layer in contact with the copper surface, using rubber covered rollers operating at a rate of 2 feet per minute at 250° F., with a pressure of 3 pounds per lineal inch at the nip. The resulting sensitized copper-clad board, protected by the polyester film, is exposed to light through a high-contrast transparency for a period of 30 seconds using a 400 watt, 50 ampere mercury vapor lamp at a distance of 12 inches.

The polyester (polyethylene terephthalate) support film is peeled off, and the exposed resist layer is developed by agitating the board in a tray containing a 1% aqueous solution of sodium carbonate monohydrate at 27° C. for approximately 1 minute followed by a water rinse. This method of development is satisfactory for the composition of Formula IA as well as the composition of Formula IB. The developed resists have a solid step of 8 and a copper step of 9 on a 21-step scale. The resists reproduce the 10.0 mil lines from the artwork within 2%.

The developed boards are etched in a 45° Baume ferric chloride etchant and the photopolymerized portions of the composition withstand the process without any signs of deterioration or breakdown. The resists are then stripped in an aqueous 3% potassium hydroxide solution at 55° C. The resist made according to Formula IA is stripped off in 27 seconds whereas the resist made according to Formula IB is stripped off in 30 seconds. The etched copper lines in both cases are straight and well-defined To measure flexibility, films prepared according to Formulas IA and IB are both laminated to cleaned flexible copper substrates, exposed without artwork to an equivalent of a step 9 on a Stouffer scale of 21, then compared for flexibility using a Gardner MG-1416 Conical Mandrel. The film prepared according to Formula IB shows a crack 48 mm long, whereas the film prepared according to Formula IA shows no crack at all.

EXAMPLE II

The following solutions are coated onto 1 mil thick polyester film, and dried in a current of hot air, provided by a GE-1500 watt fan drier for 20 minutes. The dry thickness of the sensitized layers is about 2.0 mils. The dried layers are covered with a 1 mil thick polyethylene film. Formula IIA is illustrative of the invention while Formula IIB is a control solution.

| FORMULA IIA | |
|---|---|
| (a) Copolymer of 37% styrene and 63% monobutyl maleate, average mol. wt. 20,000, viscosity of 10% aqueous solution of ammonium salt = 150 cps | 38.5 g |
| (b) Copolymer of 95% vinyl acetate and 5% crotonic acid, average mol. wt. 90,000, viscosity of 8.6% ethyl alcohol solution between 13 and 18 cps | 1.5 g |
| (c) 2,2'-methylene-bis-(4-ethyl-6-tert-butylphenol) | 0.12 g |
| (d) Benzotriazole | 0.10 g |
| (e) Leuco Crystal Violet | 0.4 g |
| (f) Victoria Blue Base dye | 0.03 g |
| (g) 2,2-Dimethoxy-2-phenylacetophenone | 5.0 g |
| (h) Trimethylolpropane triacrylate | 9.0 g |
| (i) Phenoxydiethoxyethyl acrylate | 14.0 g |
| (j) Methyl ethyl ketone | 70.0 g |
| FORMULA IIB | |
| (a) Copolymer of 37% styrene and 63% monobutyl maleate, average mol. wt. 20,000, viscosity of 10% aqueous solution of ammonium salt = 150 cps | 38.5 g |
| (b) Copolymer of 95% vinyl acetate and 5% crotonic acid, average mol. wt. 90,000, viscosity of 8.6% ethyl alcohol solution between 13 and 18 cps | 1.5 g |
| (c) 2,2'-methylene-bis-(4-ethyl-6-tert-butylphenol) | 0.12 g |
| (d) Benzotriazole | 0.10 g |
| (e) Leuco Crystal Violet | 0.4 g |
| (f) Victoria Blue Base dye | 0.03 g |
| (g) 2,2-Dimethoxy-2-phenylacetophenone | 5.0 g |
| (h) Trimethylolpropane triacrylate | 9.0 g |
| (i) Tetraethyleneglycol diacrylate | 14.0 g |
| (j) Methyl ethyl ketone | 70.0 g |

The resist films are laminated, exposed, and developed according to the method described in Example I.

The surface of the exposed copper is further cleaned after development by dipping the boards into a 20% ammonium persulfate bath for 30 seconds, washing copiously with water, dipping for 30 seconds in a 20% solution of hydrochloric acid in water, rinsing with water, then drying the boards with jets of air. The cleaned boards are immersed in an acid copper sulfate plating solution containing 19.6 g/l of copper. The plating is carried out at 25° C. for 45 minutes using 30 amps per square foot. The boards are taken from the plating tank, water rinsed, and dipped for one minute into a 30% fluoroboric acid solution.

The boards are transferred to a hi-throw tin/lead plating bath and plated for 15 minutes The plating solution contained 16 g/l of tin, 11 g/l of lead and 385 g/l of fluoboric acid. The electric current is 15 amps per square foot. After the plating cycle is completed, the boards are water-rinsed and air-dried. The resists are subjected to a Scotch Tape test to see if any lifting takes place. No lifting is seen for either Formula IIA or IIB. However, when stripped in an aqueous 3% potassium hydroxide solution at 55° C., the resist of Formula IIA is stripped off in 70 seconds, whereas the resist of Formula IIB is stripped off in 165 seconds.

EXAMPLE III

The following solutions are coated onto a 1 mil thick polyester film, and dried in a current of hot air, provided by a GE-1500 watt fan drier for 20 minutes. The dry thickness of the sensitized layers is about 2.0 mils. The dried layers are covered with a 1 mil thick polyethylene film. Formula IIIA is illustrative of the invention while Formula IIIB is a control solution.

| FORMULA IIIA | |
|---|---|
| (a) Copolymer of 37% styrene and 63% monobutyl maleate, average mol. wt. 20,000, viscosity of 10% aqueous solution of ammonium salt = 150 cps | 38.5% |
| (b) Copolymer of 95% vinyl acetate and 5% crotonic acid, average mol. wt. 90,000, viscosity of 8.6% ethyl alcohol solution between 13 and 18 cps | 1.5 g |
| (c) Leuco Crystal Violet dye | 0.4 g |
| (d) Victoria Blue Base FB dye | 0.03 g |
| (e) Tripropyleneglycol diacrylate | 8.0 g |
| (f) Phenoxydiethyoxyethyl acrylate | 14.0 g |
| (g) 2,2'-methylene-bis-(4-ethyl-6-tert-butylphenol) | 0.12 g |
| (h) Benzotriazole | 0.1 g |
| (i) 2,2-Dimethoxy-2-phenylacetophenone | 4.0 g |
| (j) Methyl ethyl ketone | 63.0 g |
| FORMULA IIIB | |
| (a) Copolymer of 37% styrene and 63% monobutyl maleate, average mol. wt. 20,000, viscosity of 10% aqueous solution of ammonium salt = 150 cps | 38.5 g |
| (b) Copolymer of 95% vinyl acetate and 5% crotonic acid, average mol. wt. 90,000, viscosity of 8.6% ethyl alcohol solution between 13 and 18 cps | 1.5 g |
| (c) Leuco Crystal Violet die | 0.4 g |
| (d) Victoria Blue Base FB dye | 0.03 g |
| (e) Tripropyleneglycol diacrylate | 8.0 g |
| (f) Diethoxylated Bisphenol-A diacrylate | 14.0 g |
| (g) 2,2'-methylene-bis-(4-ethyl-6-tert-butylphenol) | 0.12 g |
| (h) Benzotriazole | 0.1 g |
| (i) 2,2-Dimethoxy-2-phenylacetophenone | 4.0 g |
| (j) Methyl ethyl ketone | 63.0 g |

As described in Example II, 2.0 mil thick films are prepared and evaluated as plating resists. Both Formulas IIIA and IIIB performed satisfactorily exhibiting no lifting as shown by the Scotch Tape test and by the absence of underplating. When stripped under the conditions described in Example II, the resist of Formula IIIA is stripped off in 57 seconds, whereas the resist of Formula IIIB is stripped off in 70 seconds.

EXAMPLE IV

The following solutions are coated onto a 1 mil thick oolyester film, and dried in a current of hot air, provided by a GE-1500 watt fan drier for 20 minutes. The dry thickness of the sensitized layers is about 2.0 mils. The dried layers are covered with a 1 mil thick polyethylene film. Formula IVA is illustrative of the invention while Formula IVB is a control solution.

| FORMULA IVA | |
|---|---|
| (a) Copolymer of 37% styrene and 63% monobutyl maleate, average mol. wt. 20,000, viscosity of 10% aqueous solution of ammonium salt = 150 cps | 38.5 g |
| (b) Copolymer of 95% vinyl acetate and 5% crotonic acid, average mol. wt. 90,000, viscosity of 8.6% ethyl alcohol solution between 13 and 18 cps | 1.5 g |
| (c) Leuco Crystal Violet dye | 0.4 g |
| (d) Victoria Blue Base FB | 0.03 g |
| (e) Trimethylolpropane triacrylate | 10.5 g |
| (f) Phenoxydiethoxyethyl acrylate | 10.5 g |
| (g) 2,2'-methylene-bis-(4-ethyl-6-tert-butylphenol) | 0.12 g |
| (h) Benzotriazole | 0.1 g |
| (i) 2,2-Dimethoxy-2-phenylacetophenone | 4.0 g |
| (j) Methyl ethyl ketone | 63.0 g |
| FORMULA IVB | |
| (a) Copolymer of 37% styrene and 63% monobutyl maleate, average mol. wt. 20,000, viscosity of 10% aqueous solution of ammonium salt = 150 cps | 38.5 g |
| (b) Copolymer of 95% vinyl acetate and 5% crotonic acid, average mol. wt. 90,000, viscosity of 8.6% ethyl alcohol solution between 13 and 18 cps | 1.5 g |
| (c) Leuco Crystal Violet dye | 0.4 g |
| (d) Victoria Blue Base FB | 0.03 g |
| (e) Tripropyleneglycol diacrylate | 8.0 g |
| (f) Triethyleneglycol diacrylate | 10.5 g |
| (g) 2,2'-methylene-bis-(4-ethyl-6-tert-butylphenol) | 0.12 g |
| (h) Benzotriazole | 0.1 g |
| (i) 2,2-Dimethoxy-2-phenylacetophenone | 4.0 g |
| (j) Methyl ethyl ketone | 63.0 g |

The two formulas are tested as plating resists according to the methods described in Examples II and III. Both films performed satisfactorily in the plating cycle, and are then stripped under the same conditions as described in Example II. The resist of Formula IVA is stripped off in 50 seconds and the resist of Formula IVB is stripped off in 128 seconds.

The films from Formulas IVA and IVB are laminated onto clean flexible copper foils, exposed, and then developed according to the methods described in Example I. The sample panels are tested for flexibility as in Example I using the Conical Mandrel. Formula IVB exhibits a crack throughout the entire length of the sample (20 cm), wherein with Formula IVA, the crack is only 10.2 cm in length, thus showing the superior flexibility of Formula IVA.

EXAMPLE V

The following solutions are coated onto 1 mil thick polyester film, and dried in a current of hot air, provided by a GE-1500 watt fan drier, for 20 minutes. The dry thickness of the sensitized layers is about 2.0 mils. The dried layers are covered with a 1 mil thick polyethylene film. Formula VA is illustrative of the invention, while Formula VB is a control solution.

| FORMULA VA | |
|---|---|
| (a) Copolymer of methyl methacrylate (35%), butyl acrylate (11%), styrene (23%), and methacrylic acid (30%), having a viscosity of 25,000 cps at 40% solids in methyl ethyl ketone/isopropyl alcohol (80/20:wt/wt) | 40.0 g |
| (b) 2,2-Dimethoxy-2-phenylacetophenone | 4.0 g |
| (c) Leuco Crystal Violet dye | 0.4 g |
| (d) Victoria Blue Base BF dye | 0.036 g |
| (e) 2,2'-methylene-bis-(4-ethyl-6-tert-butylphenol) | 0.12 g |
| (f) Benzotriazole | 0.10 g |
| (g) Trimethylolpropane triacrylate | 12.0 g |
| (h) Phenoxydiethoxyethyl acrylate | 10.0 g |
| (i) Methyl ethyl ketone | 65.0 g |
| FORMULA VB | |
| (a) Copolymer of methyl methacrylate (35%), butyl acrylate (11%), styrene (23%), and methacrylate acid (30%), having a viscosity of 25,000 cps at 40% solids in methyl ethyl ketone/isopropyl alcohol (80/20:wt/wt) | 40.0 g |
| (b) 2,2-Dimethoxy-2-phenylacetophenone | 4.0 g |
| (c) Leuco Crystal Violet dye | 0.4 g |
| (d) Victoria Blue Base FB dye | 0.036 g |
| (e) 2,2'-methylene-bis-(4-ethyl-6-tert-butylphenol) | 0.12 g |
| (f) Benzotriazole | 0.10 g |
| (g) Trimethylolpropane triacrylate | 22.0 g |
| (h) Methyl ethyl ketone | 65.0 g |

The two formulas performed satisfactorily when evaluated as plating resists as in Example II. When subjected to stripping conditions as described in Example II, the resist of Formula VA is stripped off in 54 seconds, whereas the resist of Formula VB is stripped off in 100 seconds.

Separate samples of films prepared from Formulas VA and VB are subjected to the flexibility test as described in Example I. The length of the crack with Formula VA is 10.3 cm, wherein the length of the crack with Formula VB is 13.4 cm, thus showing the superior flexibility of Formula VA.

EXAMPLE VI

The procedure of Example I is repeated except that the phenoxydiethoxyethyl acrylate of Formula IA is substituted with 10.0 g of phenoxytripropoxypropyl acrylate. Comparable results are obtained.

EXAMPLE VII

The procedure of Example I is repeated except that the phenoxydiethoxyethyl acrylate of Formula IA is substituted with 10 0 g of 4-chlorophenoxytriethoxyethyl acrylate. Comparable results are again obtained.

EXAMPLE VIII

The procedure of Example I is repeated except that the phenoxydiethoxyethyl acrylate of Formula IA is substituted with 10 g of cyclohexoxydiethoxyethyl acrylate. Comparable results are again obtained.

While the invention has been described in terms of various preferred embodiments, one skilled in the art will appreciate that various modifications, substitutions, omissions, and changes may be made without departing from the spirit thereof. Accordingly, it is intended that the scope of the present invention be limited solely by the scope of the following claims.

What is claimed is:

1. A process for preparing a printed circuit board comprising:
   A. laminating a photopolymerizable composition onto a printed circuit board precursor, said photopolymerizable composition being in the form of a storable sheet or roll on a peelable support which on a 100 parts by weight basis consists essentially of:

1. from about 10 to about 60 parts by weight of an addition polymerizable material comprised of
   (a) from about 5 to about 50 parts by weight of an acrylate having a boiling point greater than about 175° C. and having the formula

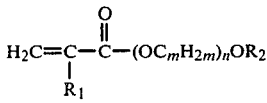

wherein m is from 1 to 4, n is from 1 to 12, $R_1$ is selected from the groupd consisting of H, $CH_3$ and mixtures thereof and $R_2$ is selected from the group consisting of unsubstituted phenyl, substituted phenyl, unsubstituted naphthenyl, substituted naphthenyl, branched or unbranched, substituted or unsubstituted alkyl having 1 to 12 carbon atoms, substituted or unsubstituted cycloalkyl having 5 or 6 carbon atoms in the ring and mixtures thereof and
   (b) from about 5 to about 50 parts by weight of one or more non-gaseous compounds, containing at least two terminal ethylenic groups and having a boiling point about 100° C;
2. from about 0.001 to about 20 parts by weight of a photoinitiated free-radical generating addition polymerization initiating system;
3. from about 0.001 to about 5 parts by weight of thermal-addition polymerization inhibitor; and
4. from about 40 to about 90 parts by weight of a preformed macromolecular polymeric binding agent which is a polymer of:
   (i) a first monomeric material which contains one or more non-acidic compounds selected from the group having the general formulas

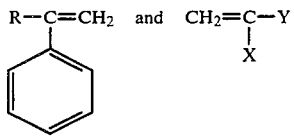

wherein R is hydrogen, an alkyl group having from 1 to 6 carbon atoms or a halo group and wherein, when X is hydrogen, Y is

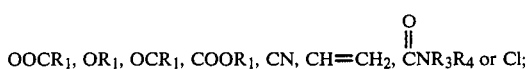

when X is methyl, Y is

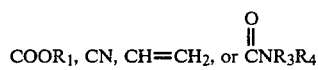

and when X is chlorine, Y is Cl, and wherein $R_1$ if an alkyl group having from 1 to 12 carbon atoms, a phenyl group or a benzyl group and $R_3$ and $R_4$ are hydrogen, an alkyl group having from 1 to 12 carbon atoms or a benzyl group; and
   (ii) a second monomeric material which consists essentially of one or more alpha, beta-ethylenically-unsaturated carboxylic acid- or anhydride-containing monomers having from 3 to 15 carbon atoms;
   wherein the ratio of the first monomeric material to the second monomeric material is sufficient to render substantially all of the binding agent soluble in a substantially wholly aqueous solution containing 1% by weight of sodium carbonate;
B. exposing selected portions of the photopolymerizable composition to actinic radiation sufficient to obtain photopolymerization of said exposed portions;
C. removing the unexposed portions of the composition to bare portions of the circuit board precursor by contact with a substantially wholly aqueous solution having an alkalinity at least as great as a 1% by weight solution of sodium carbonate;
D. modifying the bared portions of the circuit board precursor to form a selective electrically conductive pattern; and
E. stripping the exposed selected portions of the composition from the circuit board by contact with a substantially wholly aqueous solution having an alkalinity at least as great as 3% by weight solution of sodium hydroxide.

2. The process of claim 1 wherein the printed circuit board precursor is a copper clad, epoxy fiberglass laminate.

3. The process of claim 1 wherein the printed circuit board precursor is a flexible, copper clad laminate.

4. The process of claim 1 wherein the printed circuit board precursor has a metallic material on both sides and the photopolymerizable composition is laminated to both sides on top of said metallic material.

5. The process of claim 1 wherein the bared portions of the circuit board precursor are modified by etching.

6. The process of claim 1 wherein the bared portions of the circuit board precursor are modified by plating.

7. The process of claim 1 wherein the time required for stripping the exposed selected portions of the composition is reduced by about 10 to about 80% compared to a like composition absent said acrylate in the addition polymerizable material under the same conditions.

8. The process of claim 1 wherein the peelable support is removed before exposure to actinic radiation.

9. The process of claim 1 wherein the peelable support is removed after exposure to actinic radiation and before removing the unexposed portions of the composition.

10. A process for chemical machining comprising:
A. laminating a photopolymerizable composition onto both sides of a metallic sheet or foil, said photopolymerizable composition being in the form of a storable sheet or roll on a peelable support which on a 100 parts by weight basis consists essentially of:
   1. from about 10 to about 60 parts by weight of an addition polymerizable material comprises of
      (a) from about 5 to about 50 parts by weight of an acrylate having a boiling point greater than about 175° C. and having the formula

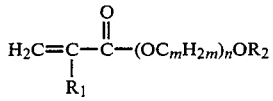

wherein m is from 1 to 4, n is from 1 to 12, $R_1$ is selected from the group consisting of H, $CH_3$ and mixtures thereof and $R_2$ is selected from the group consisting of unsubstituted phenyl, substituted phenyl, unsubstituted naphthenyl, substituted naphthenyl, branched or unbranched, substituted or unsubstituted alkyl having 1 to 12 carbon atoms, substituted or unsubstituted cycloalkyl having 5 or 6 carbon atoms in the ring and mixtures thereof and (b) from about 5 to about 50 parts by weight of one or more non-gaseous compounds, containing at least two terminal ethylenic groups and having a boiling point about 100° C.;

2. from about 0.001 to about 20 parts by weight of a photoinitiated free-radical generating addition polymerization initiating system;

3. from about 0.001 to about 5 parts by weight of thermal-addition polymerization inhibitor; and 4. from about 40 to about 90 parts by weight of a preformed macromolecular polymeric binding agent which is a polymer of:

(i) a first monomeric material which contained one or more non-acidic compounds selected from the group having the general formulas

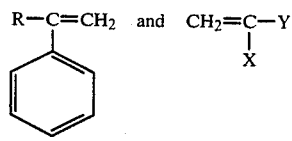

wherein R is hydrogen, an alkyl groupd having from 1 to 6 carbon atoms or a halo group and wherein, when X is hydrogen, Y is

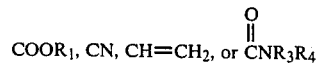

or Cl;

when X is methyl, Y is $$COOR_1, CN, CH=CH_2, \text{ or } \overset{O}{\underset{\|}{C}}NR_3R_4$$

and when X is chlorine, Y is Cl, and wherein $R_1$ is an alkyl group having from 1 to 12 carbon atoms, a phenyl group or a benzyl group and $R_3$ and $R_4$ are hydrogen, an alkyl group having from 1 to 12 carbon atoms or a benzyl group; and (ii) a second monomeric material which consists essentially of one or more alpha,beta-ethylenically-unsaturated carboxylic acid- or anhydridecontaining monomers having from 3 to 15 carbon atoms;

wherein the ratio of the first monomeric material to the second monomeric material is sufficient to render substantially all of the binding agent soluble in a substantially wholly aqueous solution containing 1% by weight of sodium carbonate;

B. exposing selected portion of the photopolymerizable composition to actinic radiation sufficient to obtain photopolymerization of said exposed portions;

C. removing the unexposed portions of the composition to bare portions of the sheet or foil by contact with a substantially wholly aqueous solution having an alkalinity at least as great as a 1% by weight solution sodium carbonate;

D. etching the bared portions of the sheet or foil to form the desired pattern; and E. stripping the exposed selected portions of the composition from the etched sheet or foil by contact with a subtstantially wholly aqueous solution having an alkalinity at least as great as 3% by weight solution of sodium hydroxide.

* * * * *

UNITED STATES PATENT AND TRADEMARK OFFICE
CERTIFICATE OF CORRECTION

PATENT NO. : 4,610,951

DATED : September 9, 1986

INVENTOR(S) : Melvin A. Lipson, Gene A. Derrico, Sung Y. Tark, Toshio Yamazaki

It is certified that error appears in the above—identified patent and that said Letters Patent is hereby corrected as shown below:

Col. 3, line 41, delete "or Cl;".
Col. 4, line 39, after thereof, insert a period.
Col. 6, line 47, delete spaces between "thylanthraqui" and "none".
Col. 7, line 53, delete "or Cl;".
Col. 16, Formula IIIB, item (c), change "die" to -- dye --; line 67, change "oolyester" to -- polyester -- .
Col. 19, line 13, change "groupd" to -- group -- ; line 61, change "if" to -- is -- .
Col. 20, line 59, change "comprises" to -- comprised -- .
Col. 21, line 28, change "contained" to -- contains -- ; line 41, change "groupd" to -- group -- .
Col. 22, line 5, delete "or Cl;"; line 21, insert a hyphen between "anhydride" and "containing"; line 28, change "portion" to -- portions -- ; line 36, insert -- of -- after "solution"; line 41, change "subtstantially" to -- substantially -- .

Signed and Sealed this

Eighth Day of November, 1988

Attest:

DONALD J. QUIGG

Attesting Officer

Commissioner of Patents and Trademarks